United States Patent
Wang et al.

(10) Patent No.: US 7,671,373 B2
(45) Date of Patent: Mar. 2, 2010

(54) LED CHIP PACKAGE STRUCTURE USING A CERAMIC MATERIAL AS A SUBSTRATE AND A METHOD FOR MANUFACTURING THE SAME

(75) Inventors: Bily Wang, Hsinchu (TW); Jonnie Chuang, Banciao (TW); Chia-Hung Chen, Yingge Township, Taipei County (TW)

(73) Assignee: Harvatek Corporation, Hsinchu (TW)

( * ) Notice: Subject to any disclaimer, the term of this patent is extended or adjusted under 35 U.S.C. 154(b) by 246 days.

(21) Appl. No.: 11/976,478

(22) Filed: Oct. 25, 2007

(65) Prior Publication Data
US 2008/0173881 A1    Jul. 24, 2008

(30) Foreign Application Priority Data
Jan. 19, 2007    (TW)    ............................ 96102114 A

(51) Int. Cl.
| | |
|---|---|
| H01L 29/267 | (2006.01) |
| H01L 21/15 | (2006.01) |
| H01L 29/26 | (2006.01) |
| H01L 31/12 | (2006.01) |
| H01L 29/16 | (2006.01) |
| H01L 29/18 | (2006.01) |
| H01L 29/22 | (2006.01) |
| H01L 29/24 | (2006.01) |
| H01L 25/16 | (2006.01) |

(52) U.S. Cl. .................. 257/81; 257/79; 257/82; 257/88; 257/99; 257/100; 257/E25.032

(58) Field of Classification Search ............... 257/79, 257/81, 82, 88, 99, 100, E25.032
See application file for complete search history.

(56) References Cited

U.S. PATENT DOCUMENTS

| | | | | |
|---|---|---|---|---|
| 6,069,440 | A * | 5/2000 | Shimizu et al. | 313/486 |
| 6,121,637 | A * | 9/2000 | Isokawa et al. | 257/99 |
| 6,874,910 | B2 * | 4/2005 | Sugimoto et al. | 362/294 |
| 6,914,267 | B2 * | 7/2005 | Fukasawa et al. | 257/98 |
| 7,012,277 | B2 * | 3/2006 | Takenaka | 257/79 |
| 7,230,280 | B2 * | 6/2007 | Yaw et al. | 257/98 |

* cited by examiner

*Primary Examiner*—Luan C Thai
(74) *Attorney, Agent, or Firm*—Rosenberg, Klein & Lee

(57) ABSTRACT

An LED chip package structure using a ceramic material as a substrate includes a ceramic substrate, a conductive unit, a hollow ceramic casing, a plurality of LED chips, and a package colloid. The ceramic substrate has a main body, and a plurality of protrusions extended from three faces of the main body. The conductive unit has a plurality of conductive layers formed on the protrusions, respectively. The hollow casing is fixed on a top face of the main body to form a receiving space for exposing a top face of each conductive layer. The LED chips are received in the receiving space, and each LED chip has a positive electrode side and a negative electrode side respectively and electrically connected to different conductive layers. In addition, the packaging colloid is filled into the receiving space for covering the LED chips.

17 Claims, 12 Drawing Sheets

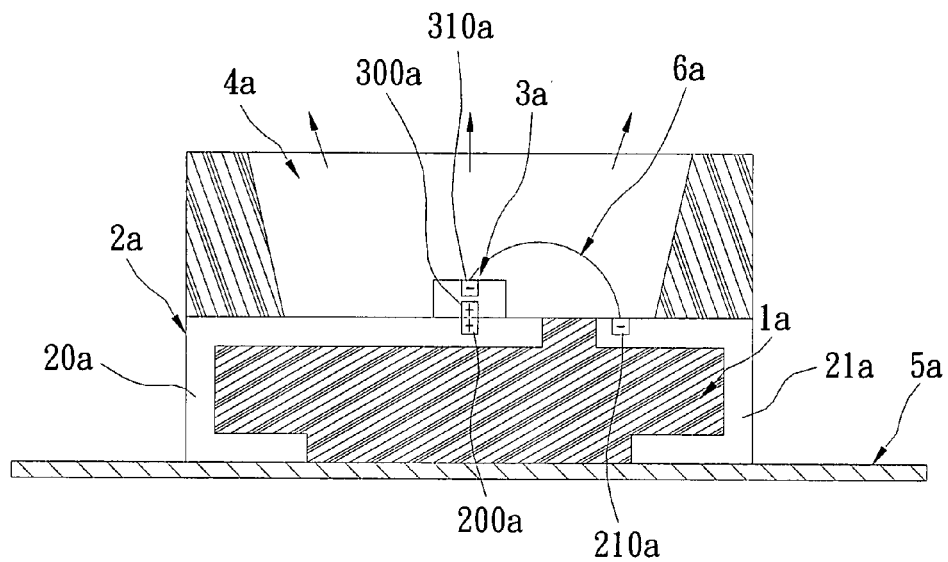
FIG. 1
PRIOR ART
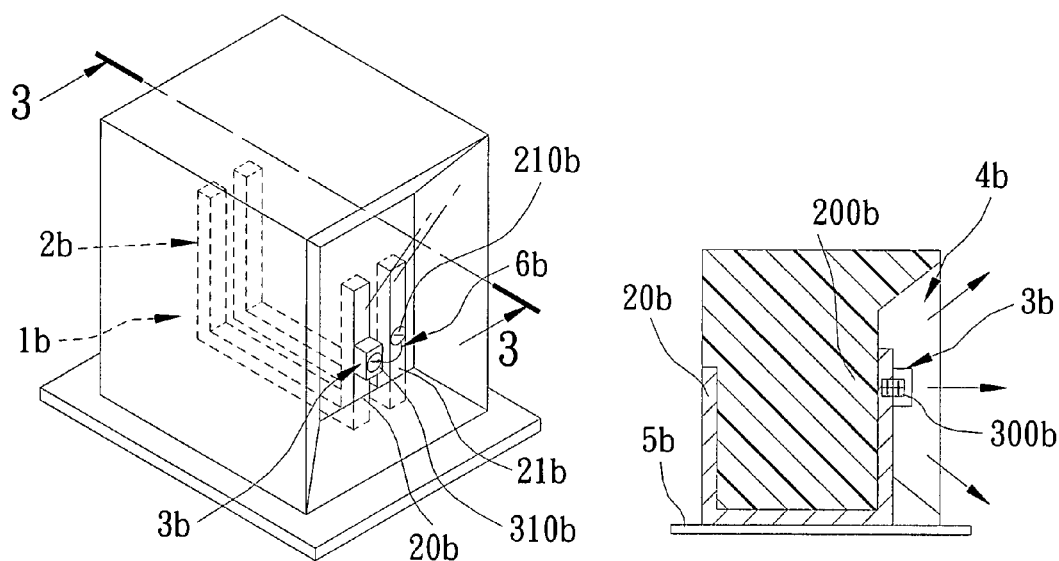
FIG. 2
PRIOR ART
FIG. 3
PRIOR ART

LED CHIP PACKAGE STRUCTURE USING A CERAMIC MATERIAL AS A SUBSTRATE AND A METHOD FOR MANUFACTURING THE SAME

BACKGROUND OF THE INVENTION

1. Field of the Invention

The present invention relates to an LED chip package structure and a method for manufacturing the same, and particularly relates to an LED chip package structure using a ceramic material as a substrate and a method for manufacturing the same.

2. Description of the Related Art

FIG. 1 shows a cross-sectional, schematic view of a vertical LED chip package structure of the prior art. The vertical LED chip package structure includes an insulative substrate 1a, a lead frame 2a, an LED chip 3a, and a fluorescent colloid 4a.

The lead frame 2a has two conductive pins 20a, 21a respectively extended along two opposite lateral sides and bent twice, so that the bottom faces of the two conductive pins 20a, 21a are electrically connected with a PCB 5a. In addition, the conductive pin 20a has a positive electrode area 200a, and the conductive pin 21a has a negative electrode area 210a.

Moreover, the LED chip 3a has a positive electrode side 300a and a negative electrode side 310a. The LED chip 3a is disposed on the conductive pin 20a directly, so that the positive electrode side 300a of the LED chip 3a is electrically connected with the positive electrode area 200a of the conductive pin 20a directly. The negative electrode side 310a of the LED chip 3a is electrically connected with the negative electrode area 210a of the conductive pin 21a via a leading wire 6a.

The fluorescent colloid 4a is covered on the LED chip 3a for protecting the LED chip 3a. Therefore, the vertical LED chip package structure should project light upwardly (such as the arrows in FIG. 1).

FIG. 2 shows a perspective, schematic view of a horizontal LED chip package structure of the prior art, and FIG. 3 shows a cross-sectional view along line 3-3 of a horizontal LED chip package structure shown in FIG. 2. The horizontal LED chip package structure includes an insulative substrate 1b, a lead frame 2b, an LED chip 3b, and a fluorescent colloid 4b.

The lead frame 2b has two conductive pins 20b, 21b respectively extended along one lateral side and bent twice, so that the bottom faces of the two conductive pins 20b, 21b are electrically connected with a PCB 5b. In addition, the conductive pin 20b has a positive electrode area 200b, and the conductive pin 21b has a negative electrode area 210b.

Moreover, the LED chip 3b has a positive electrode side 300b and a negative electrode side 310b. The LED chip 3b is disposed on the conductive pin 20b directly, so that the positive electrode side 300b of the LED chip 3b is electrically connected with the positive electrode area 200b of the conductive pin 20b directly. The negative electrode side 310b of the LED chip 3b is electrically connected with the negative electrode area 210b of the conductive pin 21b via a leading wire 6b.

The fluorescent colloid 4b is covered on the LED chip 3b for protecting the LED chip 3b. Therefore, the horizontal LED chip package structure should project light sideward (such as the arrows in FIG. 3).

However, if the conductive pins (20a, 21a, 20b, 21b) want to electrically connect with the PCB (5a, 5b), the conductive pins (20a, 21a, 20b, 21b) need to be bent twice. Therefore, the complexity of the manufacturing process in the prior art should be increased.

SUMMARY OF THE INVENTION

One particular aspect of the present invention is to provide an LED chip package structure using a ceramic material as a substrate and a method for manufacturing the same. The advantage of the present invention is that a conductive layer is formed on a ceramic substrate via any forming method, and a hollow ceramic casing is fixed on a top face of the ceramic substrate via an LTCC (Low-Temperature Cofired Ceramics). Therefore, the LED chip package structure of the present invention can electrically connect with a PCB easily without bending the conductive pins as the prior art.

In order to achieve the above-mentioned aspects, the present invention provides an LED chip package structure using a ceramic material as a substrate, comprising: a ceramic substrate, a conductive unit, a hollow ceramic casing, a plurality of LED chips, and a package colloid. The ceramic substrate has a main body, and a plurality of protrusions separated from each other and respectively extended from three faces of the main body. The conductive unit has a plurality of conductive layers formed on the protrusions, respectively. The hollow ceramic casing is fixed on a top face of the main body to form a receiving space for exposing a top face of each conductive layer. The LED chips are received in the receiving space, and each LED chip has a positive electrode side and a negative electrode side respectively and electrically connected to different conductive layers. The package colloid is filled into the receiving space for covering the LED chips.

In order to achieve the above-mentioned aspects, the present invention provides a method for manufacturing an LED chip package structure that uses a ceramic material as a substrate, comprising: providing a ceramic substrate that has a main body, and a plurality of protrusions separated from each other and respectively extended from three faces of the main body; forming a plurality of conductive layers on the protrusions, respectively; fixing a hollow ceramic casing on a top face of the main body to form a receiving space for exposing a top face of each conductive layer; receiving a plurality of LED chips in the receiving space, wherein each LED chip has a positive electrode side and a negative electrode side respectively and electrically connected to different conductive layers; and filling a package colloid into the receiving space for covering the LED chips.

Moreover, the conductive unit further comprises a first conductive unit, a hardness-strengthening unit, and a second conductive unit. The first conductive unit has a plurality of first conductive layers respectively formed on the protrusions. The hardness-strengthening unit has a plurality of hardness-strengthening layers respectively formed on the first conductive layers. The second conductive unit has a plurality of second conductive layers respectively formed on the hardness-strengthening layers. Therefore, the first conductive layers, the hardness-strengthening layers, and the second conductive layers are sequentially assembled together to form the conductive layers.

Alternatively, the conductive unit further comprises: a first conductive unit and a second conductive unit. The first conductive unit has a plurality of first conductive layers respectively formed on the protrusions. The second conductive unit has a plurality of second conductive layers respectively formed on the first conductive layers, and each second conductive layer is a hardness-strengthening layer. Therefore, the first conductive layers and the second conductive layers are sequentially assembled together to form the conductive layers.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIG. 1 is a cross-sectional, schematic view of a vertical LED chip package structure of the prior art;

FIG. 2 is a perspective, schematic view of a horizontal LED chip package structure of the prior art;

FIG. 3 is a cross-sectional view along line 3-3 of a horizontal LED chip package structure shown in FIG. 2;

DETAILED DESCRIPTION OF THE PREFERRED EMBODIMENTS

Figure 4:
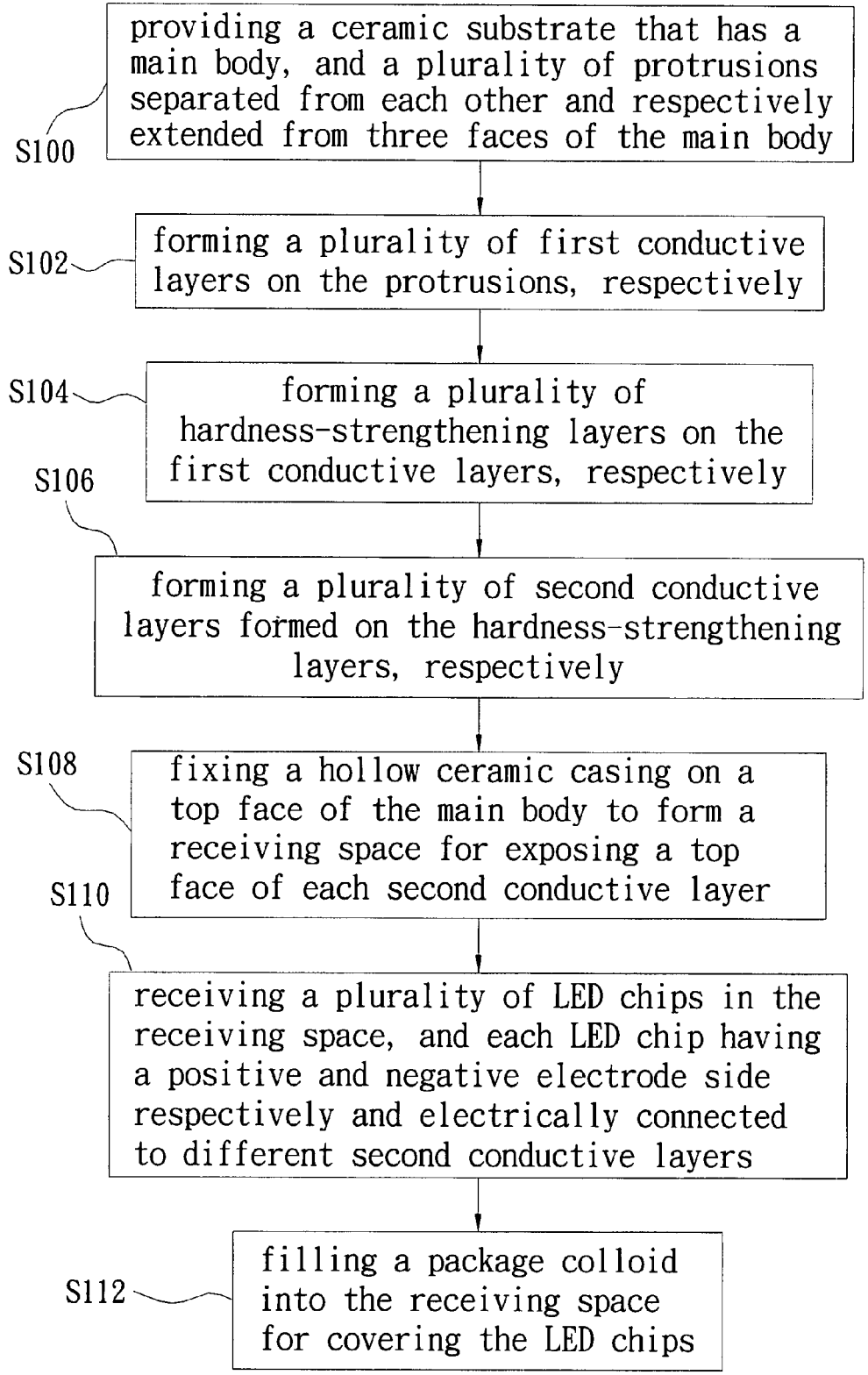
FIG. 4 is a flowchart of a method for manufacturing an LED chip package structure that uses a ceramic material as a substrate according to the first embodiment of the present invention.
Figure 5A:
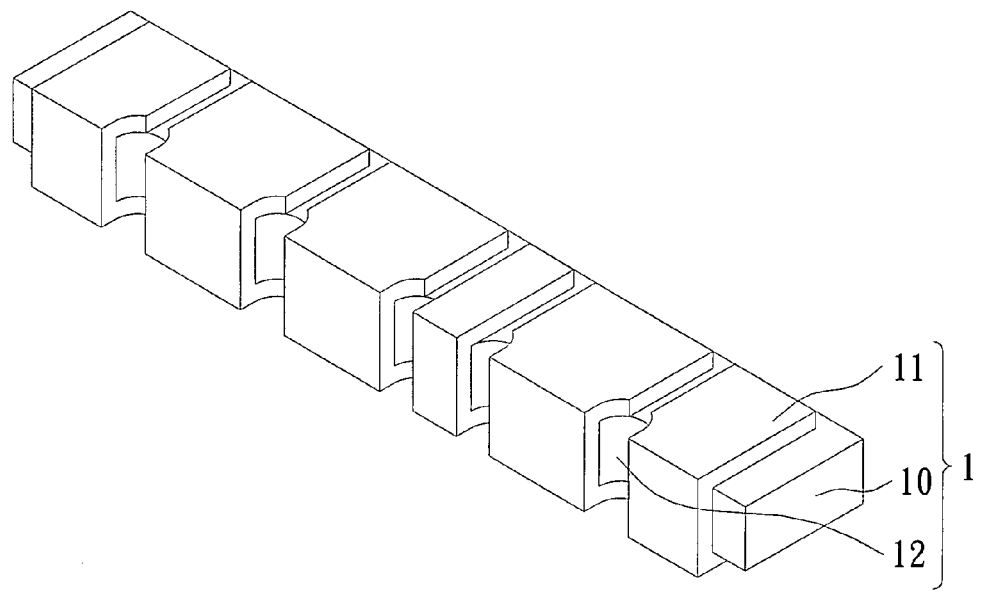
FIGS. 5A to 5C are manufacturing flowchart of a method for manufacturing an LED chip package structure that uses a ceramic material as a substrate according to the first embodiment of the present invention, respectively.
Figure 5B:
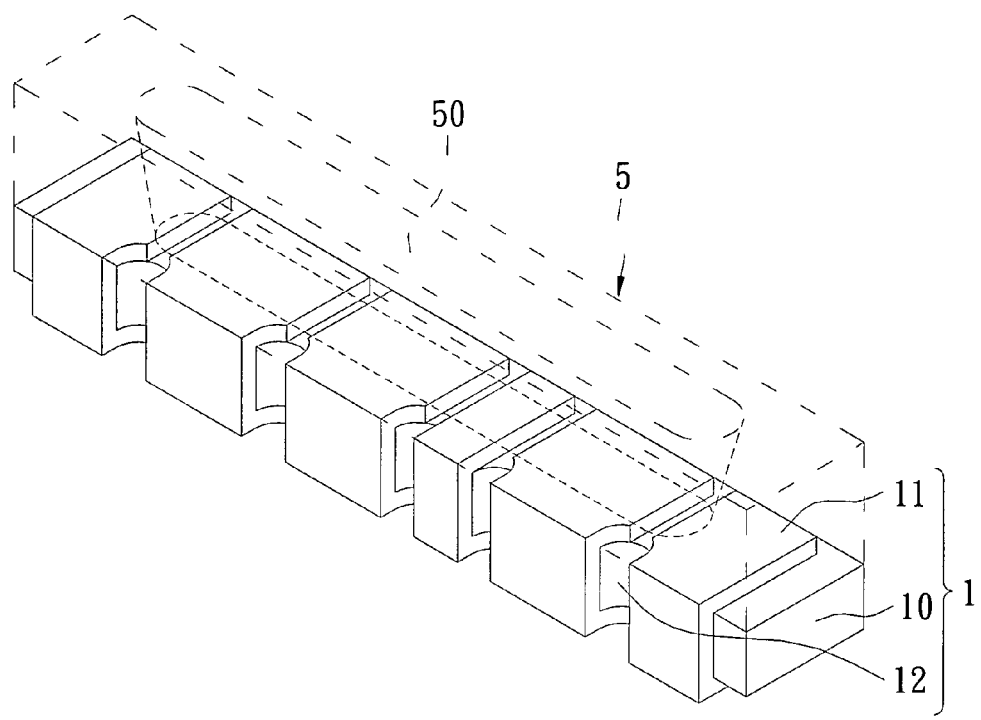
Figure 5C:
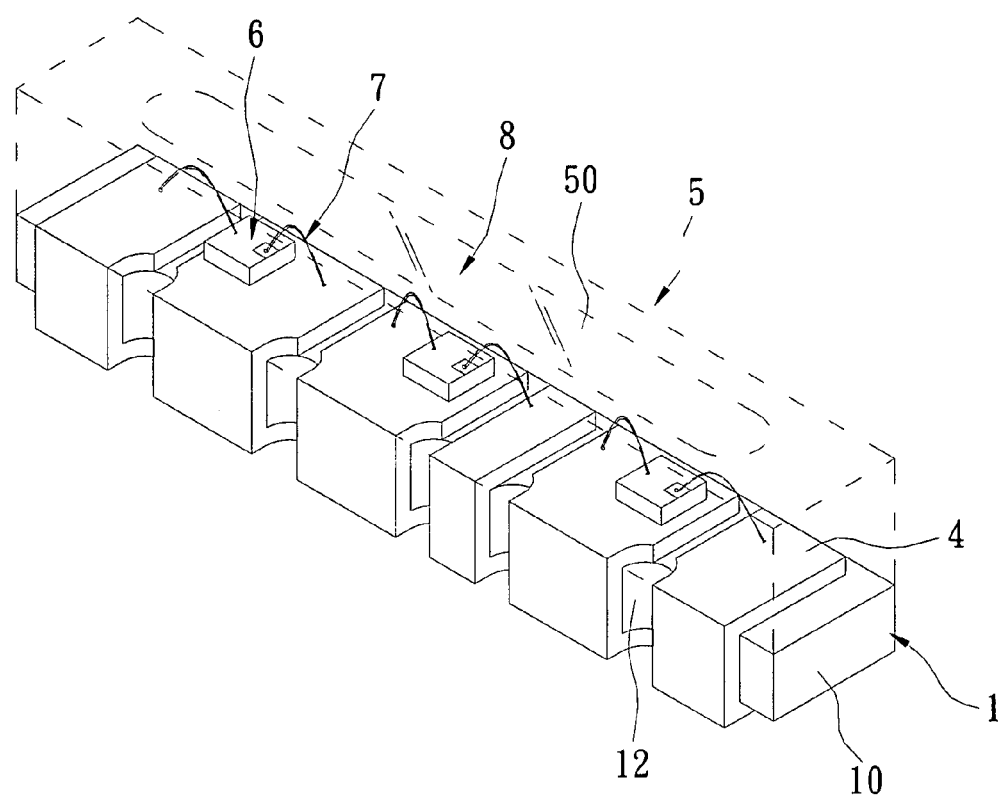
Figure 6:
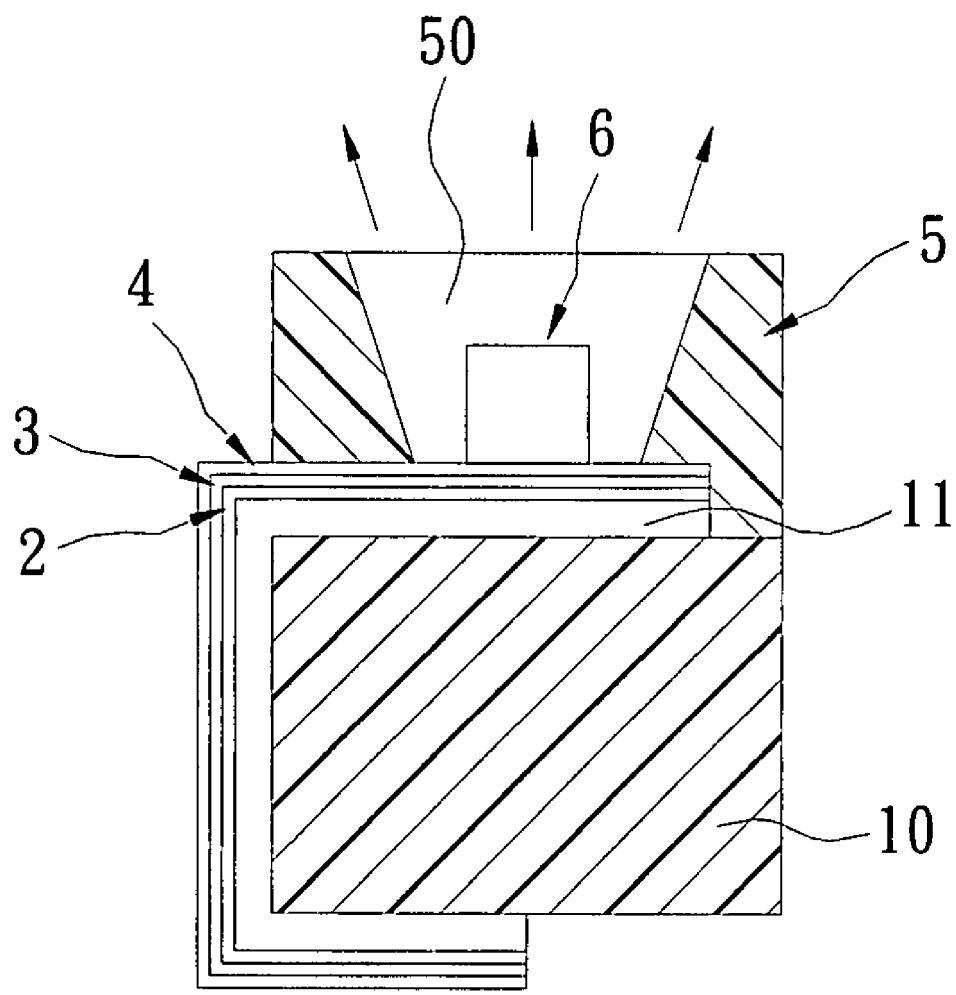
FIG. 6 is a cross-sectional, schematic view of an LED chip package structure that uses a ceramic material as a substrate according to the first embodiment of the present invention.

Referring to FIGS. 4 to 6, the first embodiment of the present invention provides a method for manufacturing an LED chip package structure that uses a ceramic material as a substrate. The steps of the method comprises: firstly, referring to FIGS. 5A and 6, providing a ceramic substrate 1 that has a main body 10, and a plurality of protrusions 11 separated from each other and respectively extended from three faces of the main body 10 (S100). The ceramic substrate 1 further has a plurality of half through holes 12 formed on a lateral side of the main body 10 and respectively between each two protrusions 11.

Moreover, the method further comprise: forming a plurality of first conductive layers 2 on the protrusions 11, respectively (S102), forming a plurality of hardness-strengthening layers 3 on the first conductive layers 2, respectively (S104), and then forming a plurality of second conductive layers 4 formed on the hardness-strengthening layers 3, respectively (S106). In addition, each first conductive layer 2 can be a silver paste layer, each hardness-strengthening layer 3 can be a nickel layer, and each second conductive layer 4 can be a gold layer or a silver layer. Furthermore, the first conductive layers 2, the hardness-strengthening layers 3, and the second conductive layers 4 are sequentially assembled together to form a plurality of conductive layers. Hence, the steps of S104 to S106 mean that forming the conductive layers on the protrusions 11, respectively.

Referring to FIGS. 5B and 6, the method further comprises: fixing a hollow ceramic casing 5 on a top face of the main body 10 of the ceramic substrate 1 to form a receiving space 50 for exposing a top face of each second conductive layer 4 (S108). The main body 10 and the hollow ceramic casing 5 are two cuboids that are mated with each other, and the hollow ceramic casing 5 is fixed on the top face of the main body 10 via an LTCC (Low-Temperature Cofired Ceramics).

Referring to FIGS. 5C and 6, the method further comprises: receiving a plurality of LED chips 6 in the receiving space 50, and each LED chip 6 having a positive electrode side and a negative electrode side respectively and electrically connected to different second conductive layers 4 (S110). The positive electrode side and the negative electrode side of each LED chip 6 are electrically connected to different second conductive layers 4 via two leading wires 7. Finally, the method comprises filling a package colloid 8 into the receiving space 50 for covering the LED chips 6 (S112). Therefore, the receiving space 50 faces top, so that bottom sides of the second conductive layers 4 contact with a PCB (not shown). Hence, the LED chip package structure should project light upwardly in a vertical status (such as the arrows in FIG. 6).

Figure 7:
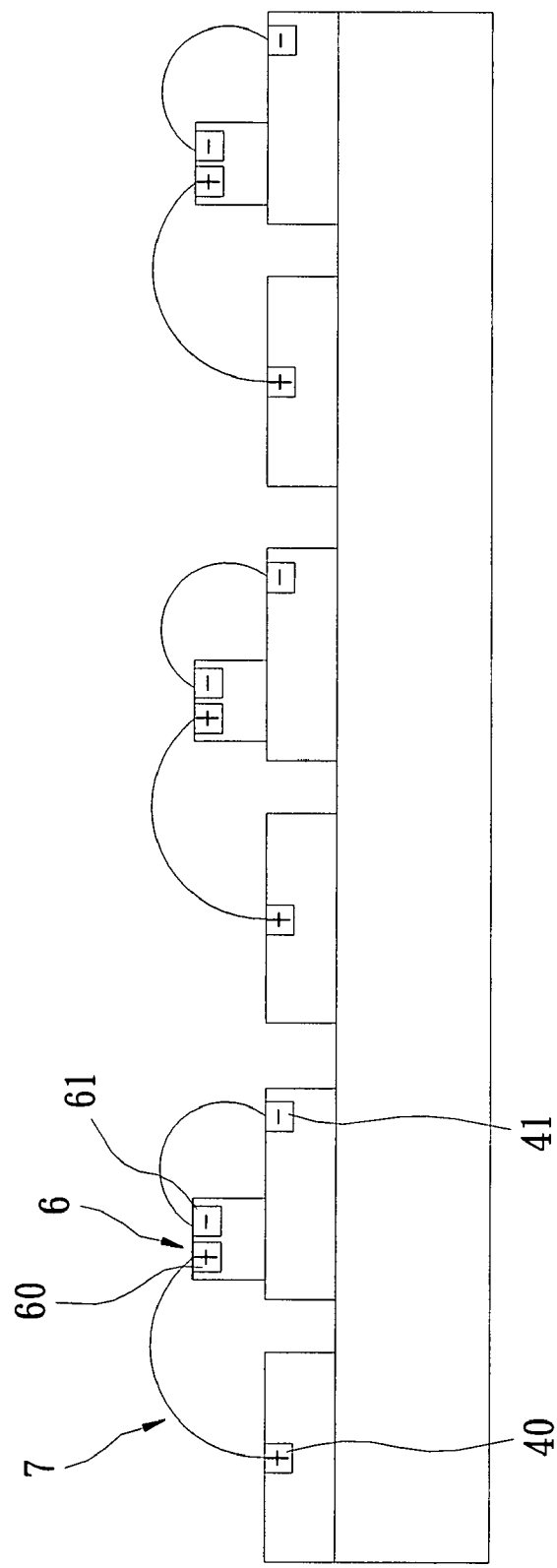
FIG. 7 is a lateral, schematic view of a first arrangement of a plurality of LED chips according to the present invention.

FIG. 7 shows a lateral, schematic view of a first arrangement of a plurality of LED chips according to the present invention. The second conductive layers 4 are divided into a plurality of positive electrode portions 40 and negative electrode portions 41. The positive electrode side 60 and the negative electrode side 61 of each LED chip 6 are arranged on an upper surface of each LED chip 6. Therefore, the positive electrode side 60 and the negative electrode side 61 of each LED chip 6 are respectively and electrically connected with the adjacent positive and negative electrode portions 40, 41 via two leading wires 41 by a wire-bounding method.

Figure 8:
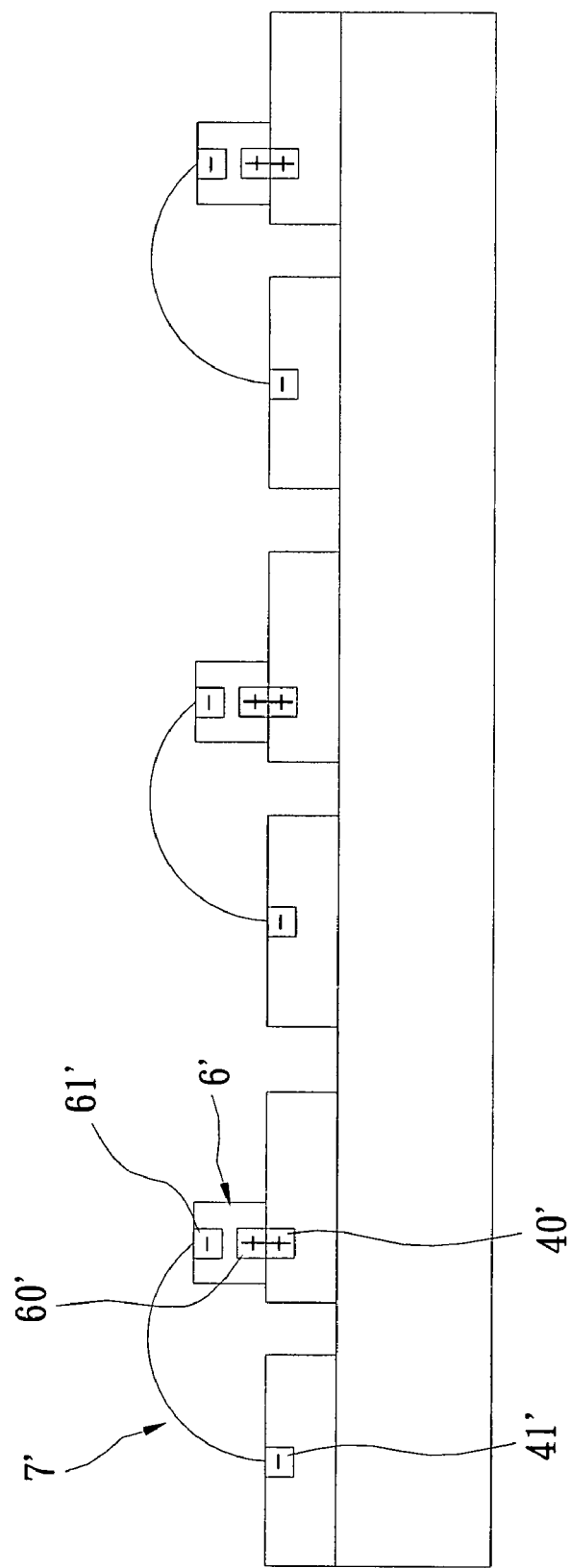
FIG. 8 is a lateral, schematic view of a second arrangement of a plurality of LED chips according to the present invention.

FIG. 8 shows a lateral, schematic view of a second arrangement of a plurality of LED chips according to the present invention. The second conductive layers 4' are divided into a plurality of positive electrode portions 40' and negative electrode portions 41'. The positive electrode side 60' and the negative electrode side 61' of each LED chip 6' are respectively arranged on a lower surface and an upper surface of each LED chip 6'. Therefore, the positive electrode side 60' of each LED chip 6' is directly and electrically connected with the corresponding positive electrode portion 40', and the negative electrode side 61' of each LED chip 6' is electrically connected with the corresponding negative electrode portion 41' via a leading wire 7' by a wire-bounding method.

Figure 9:
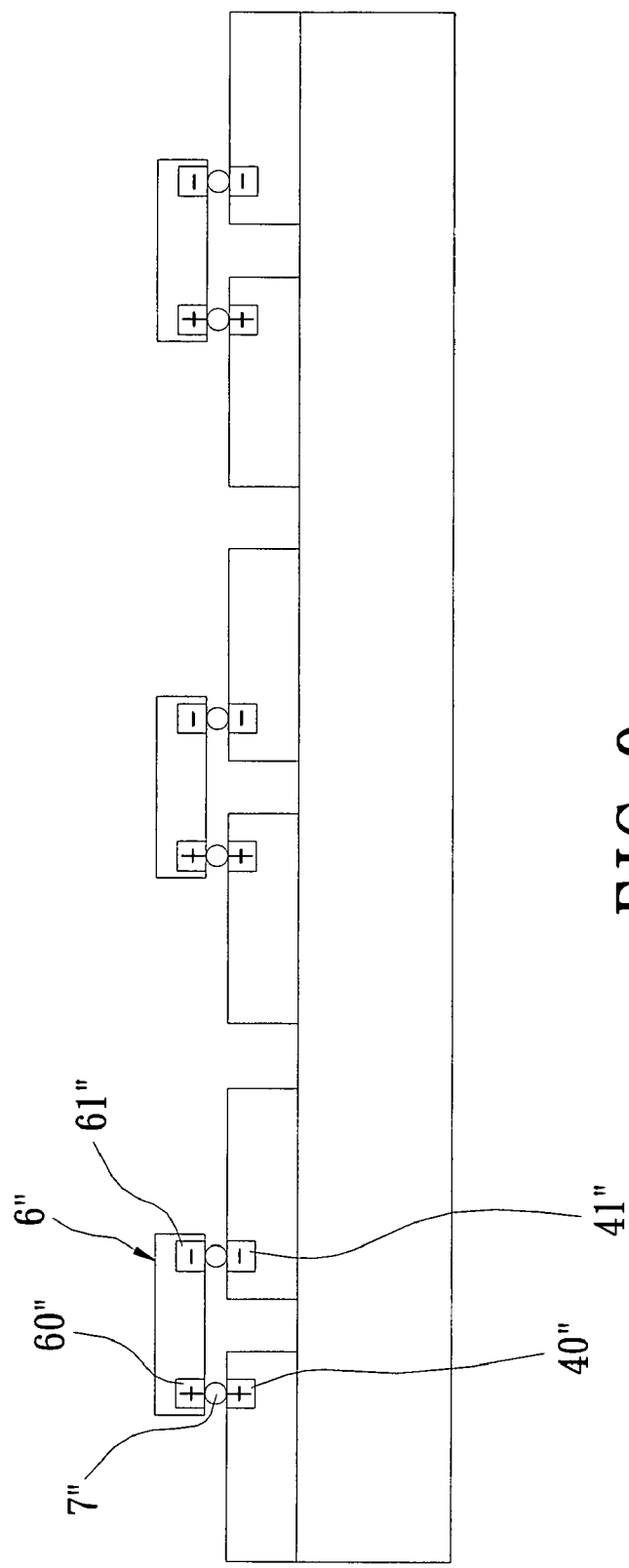
FIG. 9 is a lateral, schematic view of a third arrangement of a plurality of LED chips according to the present invention.

FIG. 9 shows a lateral, schematic view of a third arrangement of a plurality of LED chips according to the present invention. The second conductive layers 4" are divided into a plurality of positive electrode portions 40" and negative electrode portions 41". The positive electrode side 60" and the negative electrode side 61" of each LED chip 6" are arranged on a lower surface of each LED chip 6". Therefore, the positive electrode side 60" and the negative electrode side 61" of each LED chip 6" are respectively and electrically connected with the adjacent positive and negative electrode portions 40", 41" via a plurality of corresponding solder balls 7" by a flip-chip method.

Figure 10:
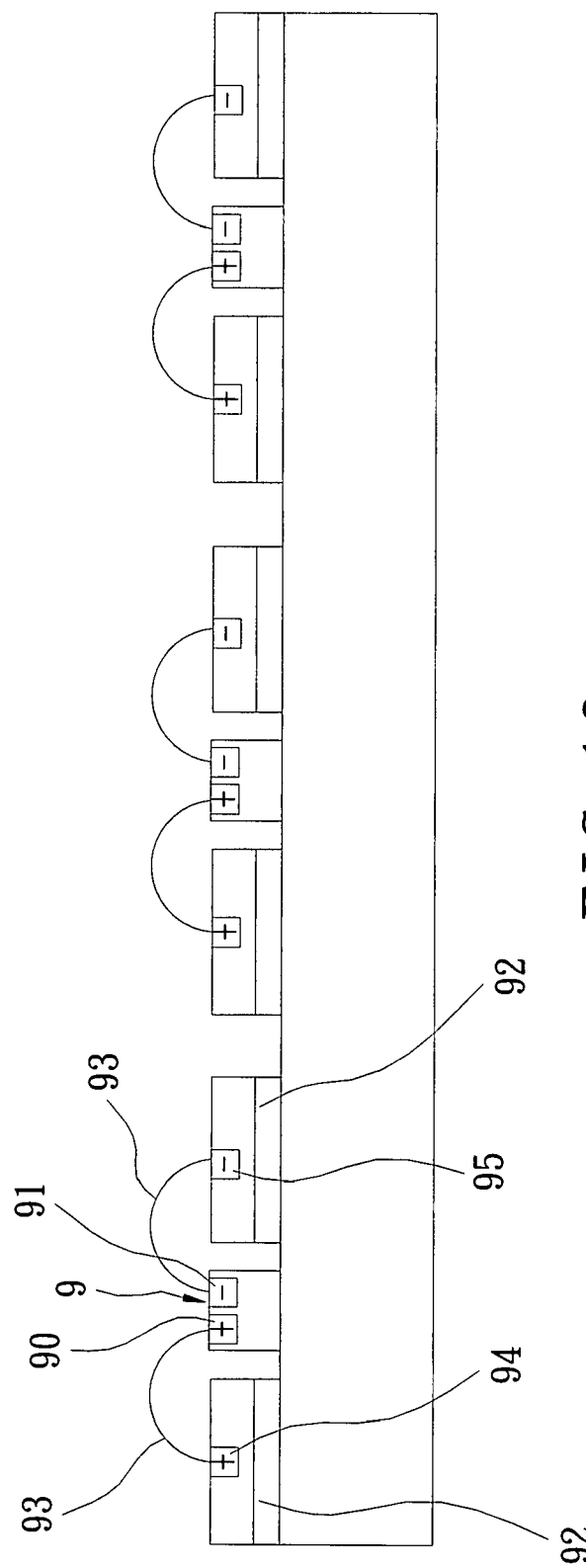
FIG. 10 is a lateral, schematic view of a fourth arrangement of a plurality of LED chips according to the present invention.

FIG. 10 shows a lateral, schematic view of a fourth arrangement of a plurality of LED chips according to the present invention. The positive electrode side 90 and the negative electrode side 91 of each LED chip 9 are arranged on an upper surface of each LED chip 9, and each LED chip 9 is disposed between each two protrusions 92. Therefore, the positive electrode side 90 and the negative electrode side 91 of each LED chip 9 are respectively and electrically connected with the adjacent positive and negative electrode portions 94, 95 via two leading wires 93 by a wire-bounding method.

Figure 11:
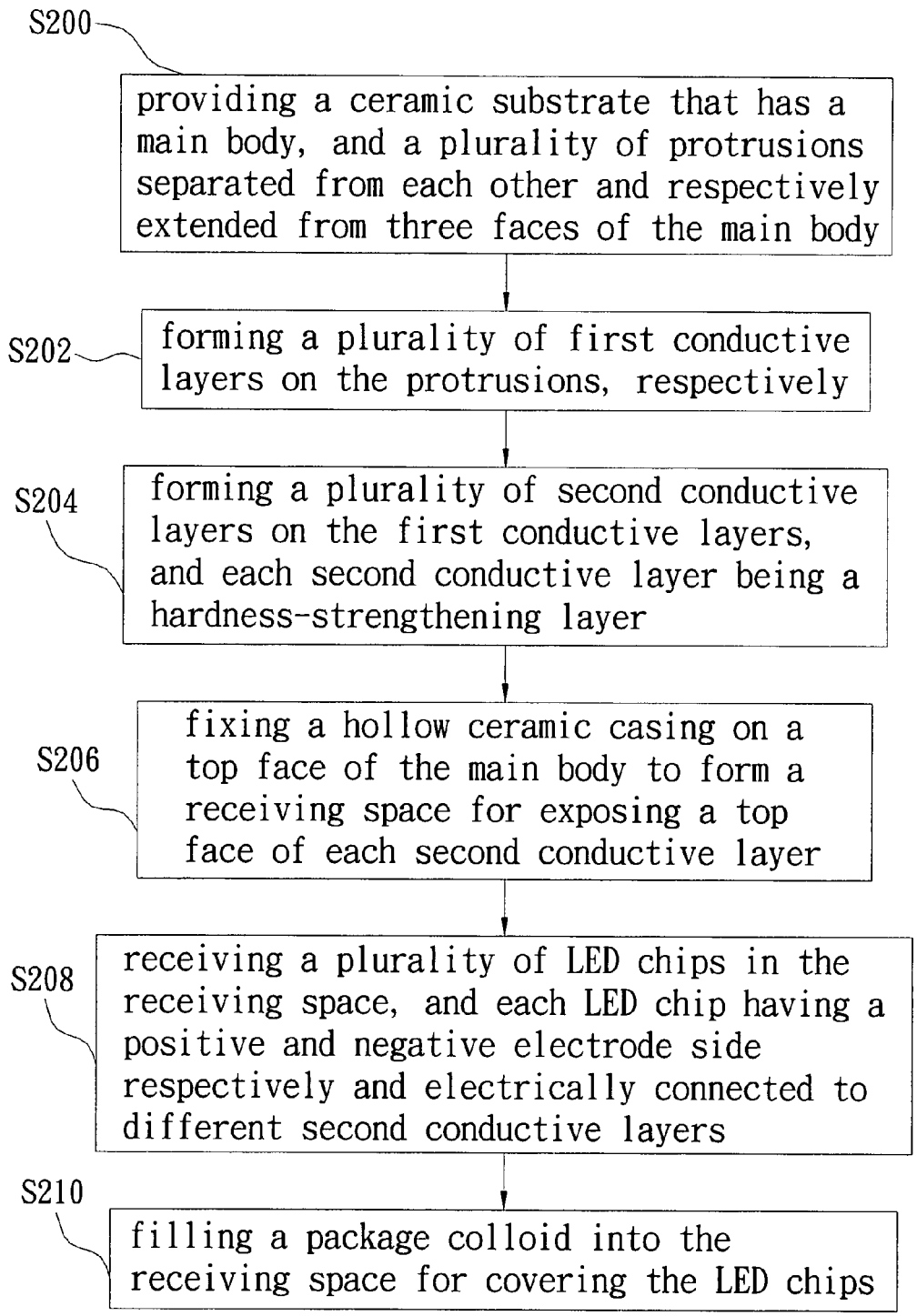
FIG. 11 is a flowchart of a method for manufacturing an LED chip package structure that uses a ceramic material as a substrate according to the second embodiment of the present invention.
Figure 12:
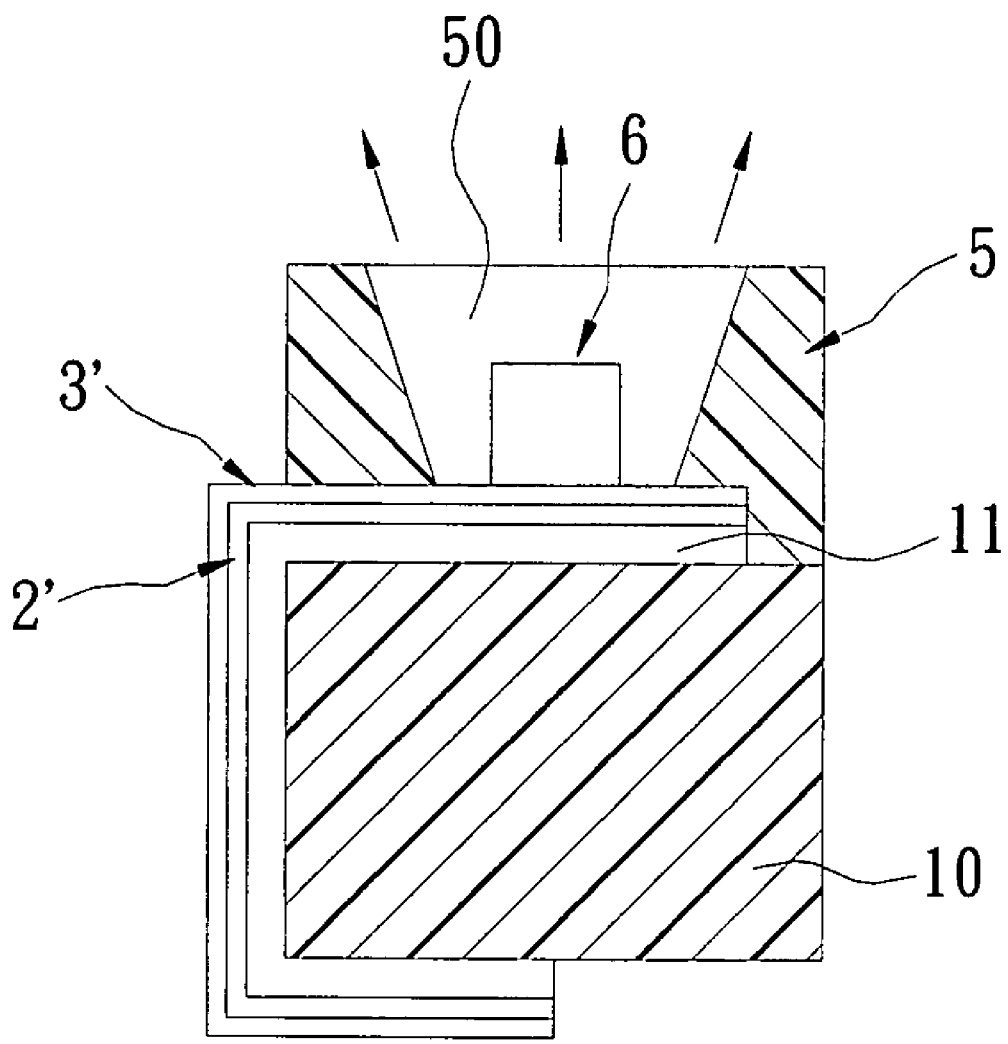
FIG. 12 is a cross-sectional, schematic view of an LED chip package structure that uses a ceramic material as a substrate according to the second embodiment of the present invention.

Referring to FIGS. 11 and 12, the second embodiment of the present invention provides a method for manufacturing an LED chip package structure that uses a ceramic material as a substrate. The steps of S200-S202 and S206-S210 in the second embodiment are same as the steps of S100-S102 and S108-S112 in the first embodiment. The differences between the second embodiment and the first embodiment is that after the step of S202, the method comprises forming a plurality of second conductive layers 3' on the first conductive layers 2, and each second conductive layer 3' being a hardness-strengthening layer (S204). Furthermore, the first conductive layers 2 and the second conductive layers 3' are sequentially assembled together to form a plurality of conductive layers. Hence, the steps of S202 to S204 mean that forming the conductive layers on the protrusions 11, respectively.

Figure 13:
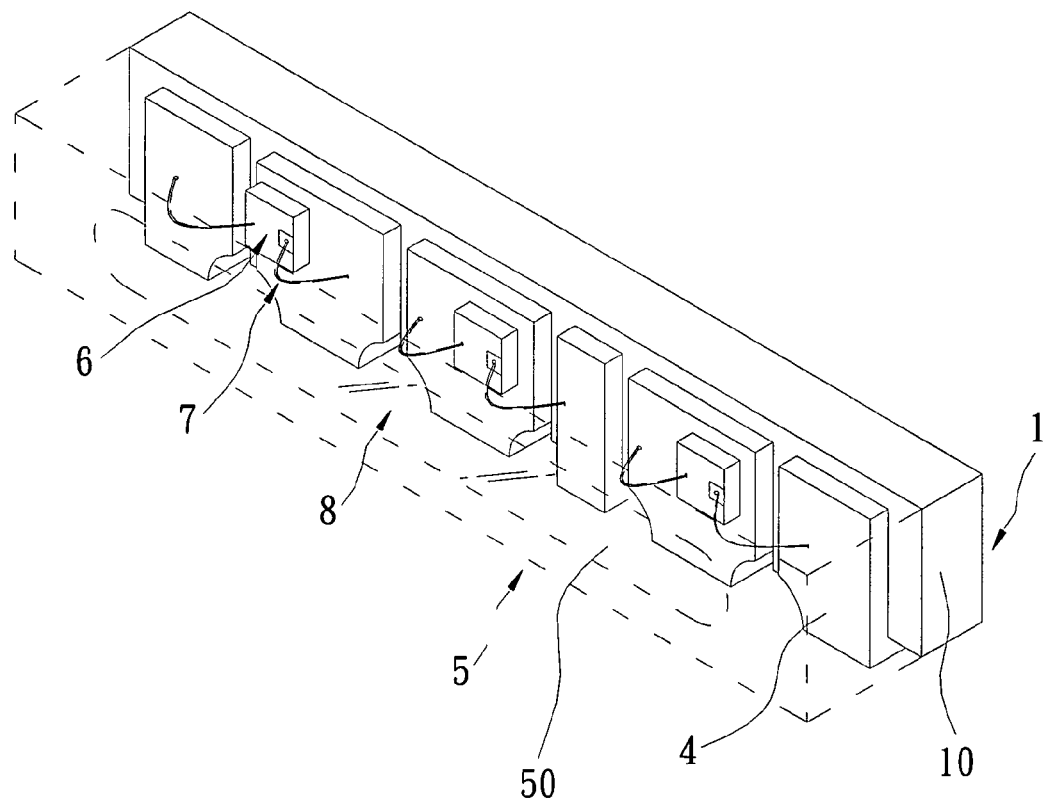
FIG. 13 is a perspective, schematic view of an LED chip package structure in a horizontal status according to the second embodiment of the present invention.

FIG. 13 shows a perspective, schematic view of an LED chip package structure in a horizontal status according to the second embodiment of the present invention. The receiving space 50 faces lateral, so that lateral sides of the second conductive layers 3' contact with a PCB (not shown). Hence, the LED chip package structure should project light sideward in a horizontal status (such as the arrows in FIG. 12).

In conclusion, the advantage of the present invention is that the conductive layers is formed on the ceramic substrate 1 via any forming method, and the hollow ceramic casing 5 is fixed on the top face of the ceramic substrate 1 via an LTCC (Low-Temperature Cofired Ceramics). Therefore, the LED chip package structure of the present invention can electrically connect with a PCB (not shown) easily without bending the conductive pins (20a, 21a, 20b, 21b) as the prior art.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED chip package structure using a ceramic material as a substrate, comprising:
    a ceramic substrate having a main body, and a plurality of protrusions separated from each other and respectively extended from three faces of the main body;
    a conductive unit having a plurality of conductive layers formed on the protrusions, respectively;
    a hollow ceramic casing fixed on a top face of the main body to form a receiving space for exposing a top face of each conductive layer;
    a plurality of LED chips received in the receiving space, wherein each LED chip has a positive electrode side and a negative electrode side respectively and electrically connected to different conductive layers; and
    a package colloid filled into the receiving space for covering the LED chips.

2. The LED chip package structure as claimed in claim 1, wherein the ceramic substrate has a plurality of half through holes formed on a lateral side of the main body and respectively between each two protrusions.

3. The LED chip package structure as claimed in claim 1, wherein the main body and the hollow ceramic casing are two cuboids that are mated with each other.

4. The LED chip package structure as claimed in claim 1, wherein the conductive unit further comprises:
    a first conductive unit having a plurality of first conductive layers respectively formed on the protrusions;
    a hardness-strengthening unit having a plurality of hardness-strengthening layers respectively formed on the first conductive layers; and
    a second conductive unit having a plurality of second conductive layers respectively formed on the hardness-strengthening layers;
    whereby, the first conductive layers, the hardness-strengthening layers, and the second conductive layers are sequentially assembled together to form the conductive layers.

5. The LED chip package structure as claimed in claim 4, wherein each first conductive layer is a silver paste layer.

6. The LED chip package structure as claimed in claim 4, wherein each hardness-strengthening layer is a nickel layer.

7. The LED chip package structure as claimed in claim 4, wherein each second conductive layer is a gold layer or a silver layer.

8. The LED chip package structure as claimed in claim 1, wherein the conductive unit further comprises:
    a first conductive unit having a plurality of first conductive layers respectively formed on the protrusions; and
    a second conductive unit having a plurality of second conductive layers respectively formed on the first conductive layers, wherein each second conductive layer is a hardness-strengthening layer;
    whereby, the first conductive layers and the second conductive layers are sequentially assembled together to form the conductive layers.

9. The LED chip package structure as claimed in claim 8, wherein each first conductive layer is a silver paste layer.

10. The LED chip package structure as claimed in claim 8, wherein each second conductive layer is a gold layer or a silver layer.

11. The LED chip package structure as claimed in claim 1, wherein the receiving space faces top, so that bottom sides of the conductive layers contact with a PCB.

12. The LED chip package structure as claimed in claim 1, wherein the receiving space faces lateral, so that lateral sides of the conductive layers contact with a PCB.

13. The LED chip package structure as claimed in claim 1, wherein the conductive layers are divided into a plurality of positive electrode portions and negative electrode portions.

14. The LED chip package structure as claimed in claim 13, wherein the positive electrode side and the negative electrode side of each LED chip are arranged on an upper surface of each LED chip; whereby, the positive electrode side and the negative electrode side of each LED chip are respectively and electrically connected with the adjacent positive and negative electrode portions via two leading wires by a wire-bounding method.

15. The LED chip package structure as claimed in claim 13, wherein the positive electrode side and the negative electrode side of each LED chip are respectively arranged on a lower surface and an upper surface of each LED chip; whereby, the positive electrode side of each LED chip is directly and electrically connected with the corresponding positive electrode portion, and the negative electrode side of each LED chip is electrically connected with the corresponding negative electrode portion via a leading wire by a wire-bounding method.

16. The LED chip package structure as claimed in claim 13, wherein the positive electrode side and the negative electrode side of each LED chip are arranged on a lower surface of each LED chip; whereby, the positive electrode side and the negative electrode side of each LED chip are respectively and electrically connected with the adjacent positive and negative electrode portions via a plurality of corresponding solder balls by a flip-chip method.

17. The LED chip package structure as claimed in claim 13, wherein the positive electrode side and the negative electrode side of each LED chip are arranged on an upper surface of each LED chip, and each LED chip is disposed between each two protrusions; whereby, the positive electrode side and the negative electrode side of each LED chip are respectively and electrically connected with the adjacent positive and negative electrode portions via two leading wires by a wire-bounding method.

* * * * *